United States Patent [19]
Urs et al.

[11] Patent Number: 5,644,220
[45] Date of Patent: Jul. 1, 1997

[54] PROCESS AND APPARATUS FOR MEASURING CHARGE QUANTITY FLOWING IN A VACUUM

[75] Inventors: Waelchli Urs, Heiligkreuz; Stoeckli Armin Leo, Sargans; Boesch Martin, Azmoos, all of Switzerland

[73] Assignee: Balzers Aktiengesellschaft, Liechtenstein

[21] Appl. No.: 388,232

[22] Filed: Feb. 13, 1995

[30] Foreign Application Priority Data

Feb. 11, 1994 [CH] Switzerland ............... 417/94

[51] Int. Cl.$^6$ ............... G01R 27/26
[52] U.S. Cl. ............ 324/71.3; 324/464; 250/397
[58] Field of Search .............. 324/71.3, 71.1, 324/464; 250/397

[56] References Cited

U.S. PATENT DOCUMENTS

| | | | |
|---|---|---|---|
| 2,814,730 | 11/1957 | Fechter | 324/71.3 |
| 3,239,664 | 3/1966 | Farrel | 324/71.3 |
| 3,445,757 | 5/1969 | Krucoff | 324/464 |
| 4,629,975 | 12/1986 | Fiorito et al. | 324/71.3 |
| 4,691,160 | 9/1987 | Ino | 324/71.3 |
| 4,724,394 | 2/1988 | Langer et al. | 324/464 |
| 4,992,742 | 2/1991 | Okuda et al. | 324/71.3 |
| 4,994,748 | 2/1991 | Rasulev et al. | 324/464 |
| 5,394,090 | 2/1995 | Wentworth et al. | 324/464 |

FOREIGN PATENT DOCUMENTS

| | | |
|---|---|---|
| 0 172 477 A3 | 2/1986 | European Pat. Off. |
| 28 36 671 | 4/1979 | Germany |

OTHER PUBLICATIONS

Current Measurement on MeV Energy Iion Beams; F. Paszti, A. Manuaba, C. Hajdu, A. A. Melo and M.F. da Silva; Nuclear Instruments and Methods in Physics Research B47 (1990) 187–192, pp. 187–192 Apr. 1990.

Small Pickup For Current And Profile Of Beam Of Pulsed Electrostatic Proton Accelerator, V. N. Getmanov, 7164 Instruments and Experimental Techniques 28 (1985) Jan.–Feb., No. 1, Part 1, New York, USA, pp. 35–39.

*Primary Examiner*—Maura K. Regan
*Attorney, Agent, or Firm*—Evenson, McKeown, Edwards & Lenahan, P.L.L.C.

[57] ABSTRACT

For measuring the charge transported in an ion or electron beam, collecting grids are provided in a cascaded manner and the galvanic currents occurring there are measured. The same surface range is measured on the collecting cascade with respect to the particle current in the vacuum. The process and apparatus have particular applicability in partial-pressure and total-pressure measuring apparatuses, e.g. mass spectrometers and Bayard-d'Alpert tubes.

19 Claims, 2 Drawing Sheets

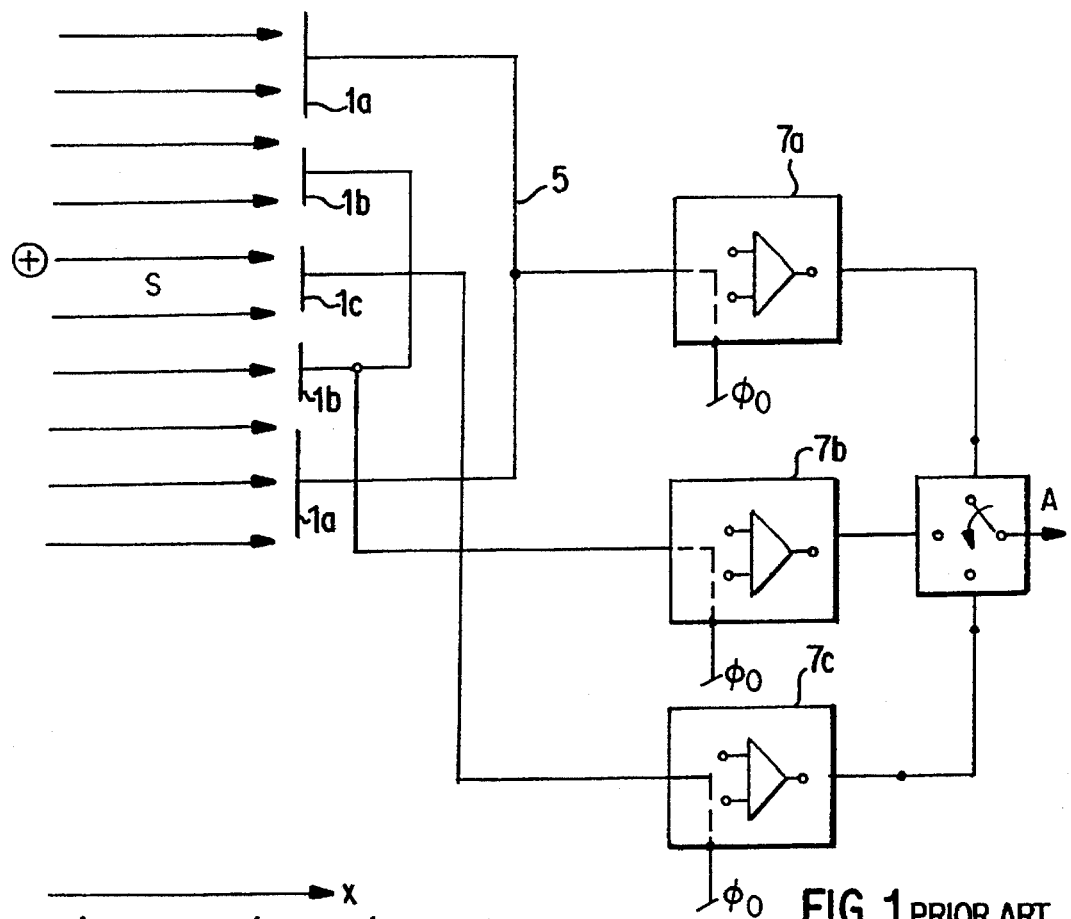
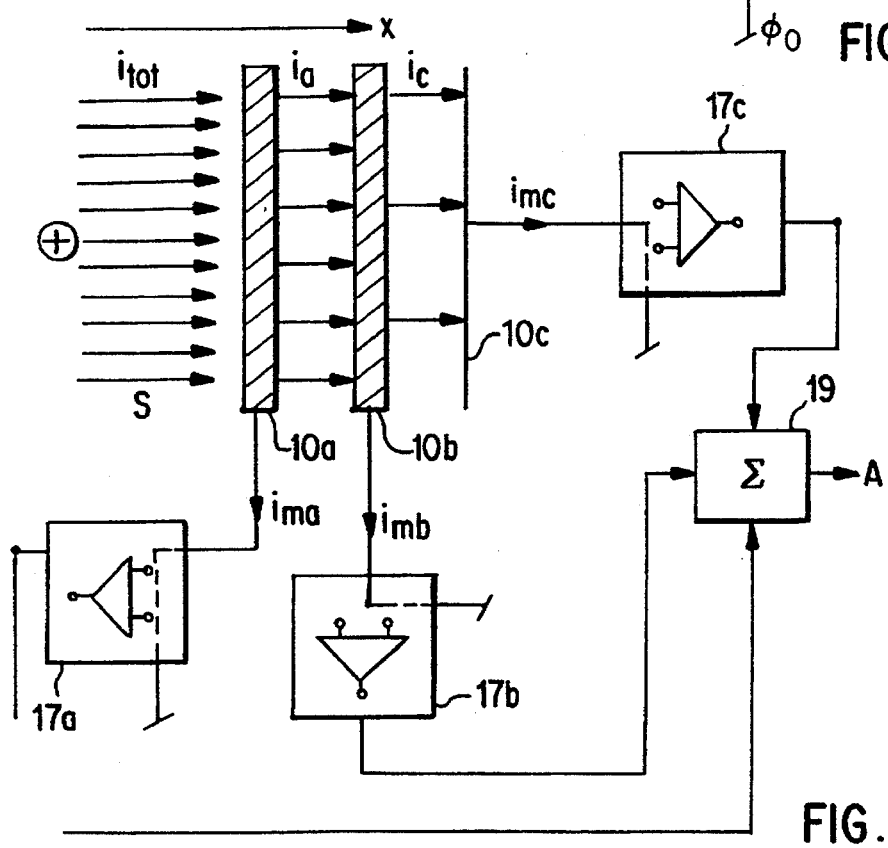
FIG. 1 PRIOR ART
FIG. 2

PROCESS AND APPARATUS FOR MEASURING CHARGE QUANTITY FLOWING IN A VACUUM

BACKGROUND AND SUMMARY OF THE INVENTION

The present invention relates to a process for measuring electric charge quantity flowing per unit time through a vacuum volume range in a given direction, to a measuring apparatus for carrying out that process in which particle currents are measured simultaneously in a weighted manner, and to a use of the process and the measuring apparatus such that the collectors are operatively connected simultaneously with current measuring circuits for different current ranges, and a superimposing unit is operatively connected with the current measuring circuits such that output signals of the current measuring circuits are superimposed.

It is known to at least partially collect the electric charge quantity flowing in a vacuum, whether caused by ions or electrons, by providing collector arrangements in the flow path. The collector arrangement is connected to a current measuring circuit for a galvanic current, that is, an electron conduction current, and the galvanic current caused by the collecting rate is measured by a current measuring arrangement, such as an electrometer circuit. Such collector arrangements are also connected in front of photoelectron multipliers in order to increase the sensitivity.

The current measuring range is limited by the dynamic range of the collector arrangement or by the dynamic range of the operability of the current measuring arrangement or by the electronic system provided for this purpose. In practice, the dynamic range is increased by the change-over of the sensitivity, i.e., of the measuring range, of the electronic measuring system, and as a result of the fact that, with respect to the flow direction of the charge carriers in the vacuum, several collector arrangements are arranged in parallel (side by side), the dynamic range is in each case connected with an electronic measuring system with a different measuring range.

It is also known to use logarithmic amplifiers for measuring the galvanic current which, however, in low current ranges (i.e., for example, in the pA-range), is accompanied by a loss of accuracy and results in large measuring time constants during the measuring of galvanic currents, such as below 10 pA. "Accuracy" as used herein is defined as a measure of the closeness of agreement of an instrument reading compared to that of a primary standard having absolute traceability to a standard sanctioned by a recognized standards organization. This definition corresponds to the one used in "Low Level Measurements", Keithley Instruments, Inc., Cleveland, Ohio 44139, USA (4th Ed.). Therefore, although logarithmic amplifiers would result in a large dynamic range, they are unsuitable for this measurement in many practical applications.

By positioning the collectors in parallel in the particle current, for example, in an ion or electron beam, implemented in the above-mentioned manner, generally two objectives are contemplated. First, the dynamic range can be expanded in that the parallel systems are each equipped with electronic current measuring systems of different sensitivities. Second, the quality of the measurement can be evaluated to the extent dependent on the collectors, in that measuring signal deviations below the parallel collector stages can be utilized for signal correcting purposes. That is, the same readings occur in the case of the same particle currents. In this case, for calibrating purposes, a particle current is switched over between the parallel collectors.

Known systems, also called Faraday collector systems, particularly for measuring ion and/or electron currents, or combinations of such Faraday collector systems with photoelectron multipliers, such as the MCP (micro channel plate), CT (channeltron), ST (spiraltron), and electron multipliers with a discrete dynode number are systems which are operated in parallel or time-sequential systems which can be changed over with respect to time.

Parallel measuring systems of collectors are found in multiple applications, such as, for example, in magnetic mass spectrometers, such as the MAT 261 of Finnigan Co.; the leak indicator ASM 120 of Alcatel Co. or in the M.T.Esat apparatus, a 61 cm multi-detector mass spectrometer at the Australian National University introduced in *Nucl. Instrum. & Methods, Physical Research Section B*.

DE-OS 31 39 975 describes the sequential calibration of such instruments with known reference quantities. The collector arrangements per se are not affected by such calibrations, but only the electronic current measuring system connected therebehind.

Time-sequential measuring systems which, for example, have the configurations such as Faraday collecting system/Faraday collecting system, Faraday collecting system/MCP, Faraday collecting system/CT, Faraday collecting system/photoelectron multiplier (SEV), Faraday collecting system/ST, are operated in a time staggered manner, for example, by the change-over of the particle beam as described, for example, in DE-37 20 161 and in French Patent FR-2 600 416-A.

The basic disadvantage of providing collectors arranged in parallel with respect to the particle current is the fact that the charge quantity is measured at different locations. The origin of a detected signal change on one of the collectors provided in parallel in comparison to the others must not necessarily be the result of a faulty adjustment of the assigned electronic measuring system. It may also be the indication of a changing current density distribution or a change of the flowing charge density distribution above the observed surface of the particle current.

These effects, like the changes of the characteristics of the collector itself, all result in a signal change at the electronic current measuring system and cannot be separated or distinguished from one another. In fact, the parallel connection of collectors is frequently used for specifically measuring the charge density distribution in the current as a function of location. Reference is made in this respect to the above-mentioned *Nucl. Instrum. & Methods, Phys. Res. Sect. B* article, as well as to T. A. Peyser, et al., "Segmented Concentric Faraday Cup for Measurement of Time-Dependent Relativistic Electron Beam Profiles", *Rev. Sci. Instrum.* 62(12), and K. Asano, et al., "Multi-Faraday-Cup-Type-Beam Profile Monitoring System for a Dual-Beam Irradiation Facility," *Nucl. Instrum. & Methods, Phys. Res. Sect. B*.

Time-sequential processes in the case of which, particularly for reasons of selecting the measuring range, a change-over is necessary, are suitable only to a limited extent for the measuring of rapidly changing currents because, during the change-over operations, the measuring system will be blind and partly, together with the change-over, a change of the ion or electron optics will be required in the collector range.

EP-A-0 172 477 describes a process in which, particularly also ion-optically, when a given particle current limit value is reached, particles are extracted in a targeted manner. This also is a time-sequential process with the above-mentioned disadvantages.

In the case of a glow cathode ionization manometer, it is also known from DE-OS 28 36 671 to exclusively measure high pressures of the gas absorber by the simultaneous measuring of the current on an ion collector and on a lattice electrode in that the measured currents are mathematically combined and a conclusion is drawn concerning the pressure and the absorber.

The use of cascaded secondary-electron emitter grids for measuring the beam profile on a proton accelerator is known from "Small Pickup for Current and Profile of Beam of Pulsed Electrostatic Proton Accelerator", V. N. Getmanov, *Instruments and Experimental Techniques*, Volume 28, No. 1, February 1985, New York, U.S.A.

S. Paszti, et al. "Current Measurement and MeV Energy Ion Beams", *Nuclear Instruments & Methods in Physics Research, Section B: Beam Interactions with Materials and Atoms*, vol. B47, No. 2, Apr. 1, 1990, Amsterdam, discusses measurement of an ion or electron beam by a mechanically choppered Faraday.

It is an object of the present invention to provide a process and a measuring apparatus which eliminate the above-mentioned disadvantages and which make it possible continuously to measure currents of charged particles with high accuracy with a significantly increased measuring range.

The foregoing object has been achieved according to the present invention by collecting the charged particles in a given direction simultaneously and in a cascaded manner.

As a result of the fact that the collecting of the particles is carried out in a locally cascaded manner, thus locally in series, in contrast to the previous parallel collecting approach, one advantage is achieved that the same surface range is measured on the collecting cascade with respect to the particle current in the vacuum. As a result, the best possible mutual calibration may take place of the cascaded collecting or of the collectors provided for this purpose together with the current measuring circuits connected therebehind.

In a currently preferred embodiment, the cascaded collecting is carried out selectively with respect to given energy ranges of the particles, or by the fact that relative respective particle collecting rates are given.

Furthermore, the selectivity is advantageously established or adjusted by applying predeterminable electrostatic potentials to the cascaded collector stages and/or by providing the optical transmission at the provided collector stages. Optical transmission, in this case, is the interstice-to-solid ratio which the approaching particles encounter at a collector arrangement, such as a collecting grid.

A measuring apparatus according to the present invention measures the particle currents simultaneously and process them preferably in a weighted manner. The process and measuring arrangement according to the present invention are used particularly for partial-pressure and total-pressure measuring apparatuses, such as, for example, a mass spectrometer or Bayard-d'Alpert tubes.

BRIEF DESCRIPTION OF THE DRAWINGS

These and other objects, features and advantages of the present invention will become more readily apparent from the following detailed description thereof when taken in conjunction with the accompanying drawings wherein:

FIG. 1 is a schematic view of a known parallel collector arrangement comprising current measuring units of different measuring ranges assigned to the parallel stages;

FIG. 2 is a basic schematic view of a measuring arrangement according to the present invention;

DETAILED DESCRIPTION OF THE DRAWINGS

Figure 3:
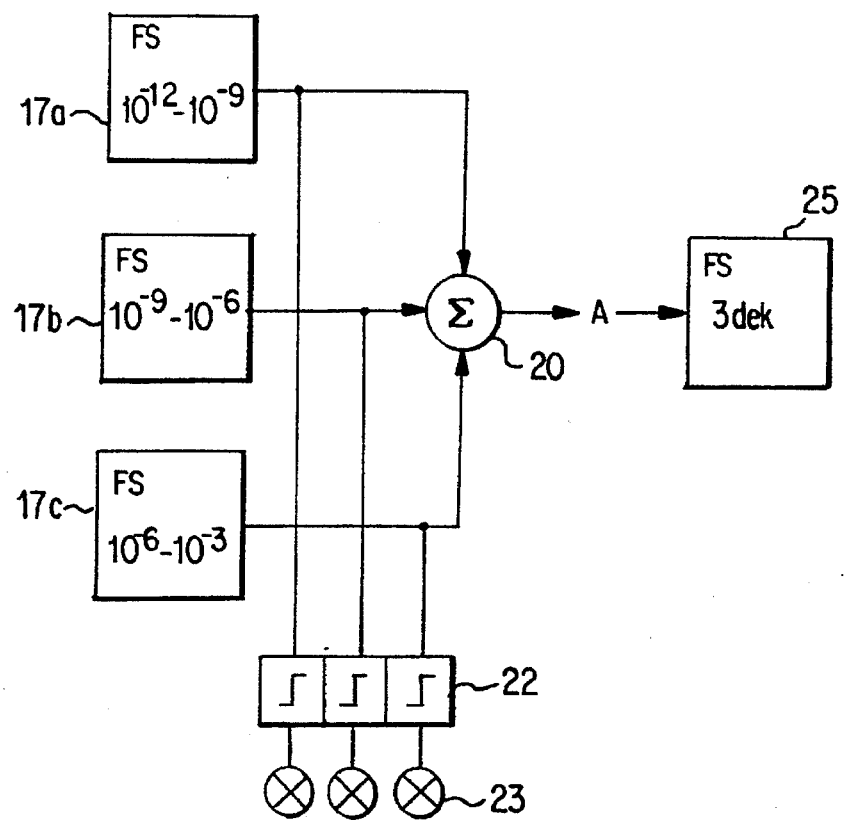
FIG. 3 is a schematic view of an embodiment of linking of the current measuring units on a common reading.

In FIG. 1, the known collector arrangement has collector surfaces $1a$, $1b$ and $1c$ arranged in the current path of electrically charged particles such as, for example, an ion beam S. The respective collector surfaces $1a$, $1b$, $1c$ are connected with a measuring current circuit 5 and are formed generally by a current measuring branch connected with reference potential $\phi_o$. The galvanic current which is caused by impingement of the charged particles on the collector surfaces $1a$, $1b$ and $1c$ in the current measuring branches, such as the recombination or photoelectron multiplier or electrostatic current, measured by current measuring units $7a$, $7b$, $7c$. For obtaining a measuring range which is as broad as possible, the known current measuring units 7 are designed with different measuring ranges and, as illustrated schematically, their outputs are selectively switched to the output A of the measuring arrangement.

As illustrated, by way of the different provided collector surfaces $1a$, $1b$, $1c$ in the beam S, the partial currents are measured on different ranges relative to the cross-sectional surface of the beam. Changes of the output signals of the current measuring units 7 may therefore originate from different non-separable effects. This renders a mutual calibration of the current measuring units 7 difficult which must be based on the fact that, in the case of identical particle currents, the same output signals must occur on the units 7, apart from the measuring range selection.

In the propagation direction indicated by the arrow x of the beam S, as illustrated in FIG. 2, at least two collectors 10, (for example, three collectors $10a$, $10b$, $10c$) are provided behind one another in a cascaded manner. The collectors $10a$ and $10b$, which are connected in front of the last collector $10c$ in the propagation direction, have percentage transmissions $T_a$, $T_b$ which are each provided with respect to the particles of beam S to be registered. Analogously to the approach according to FIG. 1, respective current measuring units $17a$, $17b$, $17c$ are provided. The current measuring units $17a$, $17b$, $17c$, together with the collectors $10a$, $10b$, $10c$ provided according to the present invention, are each configured for different measuring ranges and, as indicated schematically at unit 19, are dominant for a reading represented by arrow A with respect to the specific measuring range.

The following is obtained for the particle current $i_a$ transmitted by the collector $10a$:

$$i_a = i_{tot} T_a \qquad (1)$$

The galvanic current which is proportional to the collected particle current and which is measured at unit $17a$, $i_{ma}$, is as follows $$i_{ma} = i_{tot}(1-T_a) \tag{2}$$

Analogously, the following is obtained for the transmitted current $i_b$:

$$i_b = i_a T_b = i_{tot} T_b T_a \tag{3}$$

and for the galvanic current $i_{mb}$ on the collector 10b corresponding to the particle current i collected there:

$$i_{mb} = i_a(1-T_b) = i_{tot} T_a (1-T_b) \tag{4}$$

Finally, the following is obtained for the current $i_{mc}$ collected by the collector:

$$i_{mc} = i_b = i_{tot} T_b T_a \tag{5}$$

If now, for example, the transmission coefficients T for the collectors 10 and 10b are selected to be at 90% respectively, the following is obtained for the galvanic measuring currents:

$$i_{ma} = 0.1 i_{tot} \tag{6}$$

$$i_{mb} = 0.09 i_{tot} \tag{7}$$

$$i_{mc} = i_b = 0.81 i_{tot} \tag{8}$$

Thus, small particle currents are measured by the collector assigned to $i_{mc}$, and larger particle currents are measured by the collector assigned to $i_{ma}$ or $i_{mb}$. According to the intended use, however, other transmission values may also be used. By way of the cascaded collectors provided according to the present invention, a step-by-step provided current division at the given ratio T/1–T is carried out in the particle current.

Since the particle current which is in each case divided at the given ratio is measured on all collectors, as seen in FIG. 3, the output signals of the current measuring units 17a, 17b, 17c, designed full-scale, for example, for three current decades respectively, can be easily superimposed on a superimposing unit 20 and to lock on the output signal of the superimposing unit 20 to a reading for three decades. Simple threshold-value-sensitive units 22 and the control of corresponding readings 23 permit an indication of which decade range the decade value which is momentarily displayed on unit 25 applies to.

A considerable further expansion of the measuring range is achieved by connecting a weighting circuit behind that collector which collects the highest rate, according to FIG. 2 and the above figures, therefore, for example, collector 10. This weighting circuit has a specific function for determining the transition behavior for the measuring signal optimization, such as a non-linear current amplifier, particularly a logarithmic current amplifier. This configuration also permits a simultaneous weighted processing of the measuring signal in transition ranges.

The transmissions or the transmission coefficients T of the collectors provided in a cascaded manner according to the invention are given or adjusted by providing the optical transmission, and/or electrostatically. Preferably, grids are used as the collectors 10a, 10b which have given interstice-to-bar surface ratios corresponding to the transmission, that is, of a given optical transmission.

Figure 4:
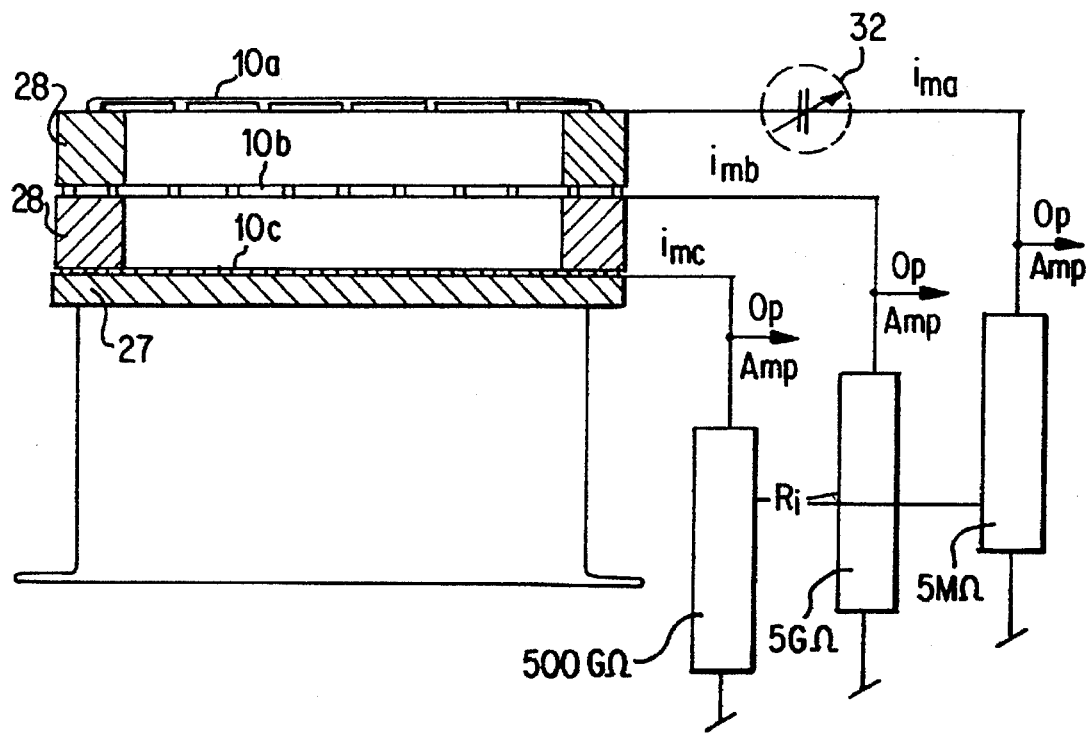
FIG. 4 is a view of a preferred implementation of a measuring arrangement similar to FIG. 2.

FIG. 4 illustrates a currently preferred embodiment of a measuring arrangement according to the present invention. The collector 10a according to FIG. 2 is implemented by a first grid, the collector 10b of FIG. 2 is implemented by a second grid, and the collector 10c is implemented by a vacuum-metallized layer, such as a gold layer. The carrier of the gold layer 27 as well as the spacers 28 between the collector grids 10a, 10b are formed by insulating spacer rings, e.g. ceramic spacer rings. In the case of an electrometer circuit of the operations amplifiers provided for measuring the current on units 17a, 17b, 17c in FIG. 2, and, as indicated above, with transmission coefficients $T_a$, $T_b$ of the collector grids 10a and 10b each designed at 90%, a graduation of the current measuring resistors $R_i$ is achieved which is described in the manner of an example.

As illustrated by a dashed circle designated by reference number 32 in FIG. 4 with respect to the collecting grid 10a, the transmission of respective collectors can now be easily changed by the fact that they are applied to a preferably adjustable potential by a voltage source. As a result, to an adjustable extent, particles of the polarity which is of interest are held back on the collector, particularly on the collector grid. Two or more grids, which are rotated with respect to one another in the grid plane, may also be used as the collecting grids. In the case of an optimally minimal mutual disconnection, by way of this combination, desired transmission coefficients can be implemented in a simple and flexible manner or can be adjusted if the rotation is adjustable.

With such an arrangement, ion or electron currents over nine and more decades can now be easily and continuously measured. Furthermore, the current measuring units can now be easily calibrated with respect to one another because the collector currents are independent of the current density distribution in the particle beam, in contrast to the known arrangement according to FIG. 1, and the transmission ratios of the collectors are given. By providing small transmissions, for example, of 10%, a graduated attenuation may be carried out.

In the case of the embodiment of a measuring apparatus according to the present invention as illustrated in FIG. 3, in which the particle currents are measured simultaneously, the ranges FS are preferably constructed in an overlapping manner for good signal processing and, in addition, a weighted superimposition is carried out preferably in the overlapping areas. In addition, tungsten wire is preferably used as the grid wire of collecting grids.

Although the invention has been described and illustrated in detail, it is to be clearly understood that the same is by way of illustration and example, and is not to be taken by way of limitation. The spirit and scope of the present invention are to be limited only by the terms of the appended claims.

We claim:

1. A process for measuring electric charge quantity which flows per unit time through a vacuum volume range in a given direction, comprising the steps of
arranging at least two collectors one behind another in the given direction so as to form a collector arrangement of independent measuring collectors each of which is configured to provide a galvanic current to a measuring circuit and at least one of which is provided with a collector surface which permits transmission of charge-transporting particles to a collector arranged downstream thereof in the given direction, and
simultaneously collecting the charge-transporting particles in the given direction.

2. The process according to claim 1, wherein, viewed in the given direction, the step of collecting takes place in a cascaded manner selectively with respect to given particle energy ranges.

3. The process according to claim 1, wherein the step of collecting takes place in a cascaded manner at given particle collecting rates relative to the total quantity of particles flowing through.

4. The process according to claim 3, wherein, viewed in the given direction, the step of collecting takes place in a cascaded manner selectively with respect to given particle energy ranges.

5. The process according to claim 1, wherein the step collecting in a cascaded manner takes place with at least one of optical transmission for the particles and electrostatic potentials at the collecting stages.

6. The process according to claim 1, wherein the galvanic current is measured from galvanic partial currents assigned to collecting cascades.

7. The process according to claim 6, wherein the particle currents are measured simultaneously and are processed in a weighted manner.

8. The process according to claim 7, wherein, viewed in the given direction, the step of collecting takes place in a cascaded manner selectively with respect to given particle energy ranges.

9. The process according to claim 8, wherein the step of collecting takes place in a cascaded manner at given particle collecting rates relative to the total quantity of particles flowing through.

10. The process according to claim 9, wherein the step collecting in a cascaded manner takes place with at least one of optical transmission for the particles and electrostatic potentials at the collecting stages.

11. A measuring apparatus for measuring a charge quantity flowing through a vacuum volume range per time unit in a given direction, comprising a collector arrangement arranged in a vacuum and a galvanic current measuring circuit operatively connected with said collector arrangement, said collector arrangement comprising at least two collectors having collector surfaces which are arranged, as viewed in the given direction, behind the other, said collectors being connected to respective current inputs of said measuring circuit to form independent measuring collectors, the collector surface of an upstream one of the collectors, as viewed in the given direction, being configured to transmit charged particles therethrough towards a collector of the downstream one.

12. The measuring apparatus according to claim 11, wherein at least one portion of the collectors comprises grids.

13. The measuring apparatus according to claim 11, wherein the collectors are operatively connected with adjustable voltage means for adjusting electrostatic potentials thereof.

14. The measuring apparatus according to claim 11, wherein the collectors are operatively connected simultaneously with current measuring circuits for different current ranges, and, a superimposing unit is operatively connected with the current measuring circuits such that output signals of the current measuring circuits are superimposed on the superimposing unit.

15. The measuring apparatus according to claim 14, wherein at least one portion of the collectors comprises grids.

16. The measuring apparatus according to claim 15, wherein the collectors are operatively connected with adjustable voltage means for adjusting electrostatic potentials thereof.

17. The measuring apparatus according to claim 12, wherein at least one collector has at least two grids arranged to be one of rotatable relative to one another and adjustably rotatable relative to one another in a grid plane.

18. The measuring apparatus according to claim 14, wherein the different current ranges overlap one another.

19. A method of using a measuring apparatus as defined in claim 11 for mass spectrometers.

* * * * *